(12) United States Patent
Miyamoto et al.

(10) Patent No.: US 7,705,245 B2
(45) Date of Patent: Apr. 27, 2010

(54) ELECTRONIC DEVICE SUBSTRATE AND ITS FABRICATION METHOD, AND ELECTRONIC DEVICE AND ITS FABRICATION METHOD

(75) Inventors: Nobuaki Miyamoto, Hitachi (JP); Akira Chinda, Hitachi (JP); Koki Hirasawa, Kawasaki (JP); Kenji Uchida, Kawasaki (JP)

(73) Assignees: Hitachi Cable, Ltd., Tokyo (JP); NEC Electronics Corporation, Kawasaki, Kanagawa (JP)

( * ) Notice: Subject to any disclaimer, the term of this patent is extended or adjusted under 35 U.S.C. 154(b) by 335 days.

(21) Appl. No.: 11/530,344

(22) Filed: Sep. 8, 2006

(65) Prior Publication Data

US 2007/0235218 A1    Oct. 11, 2007

(30) Foreign Application Priority Data

Apr. 10, 2006    (JP)    ............... 2006-107842

(51) Int. Cl.
*H01R 12/04* (2006.01)
*H05K 1/11* (2006.01)

(52) U.S. Cl. ........................ 174/260; 174/262
(58) Field of Classification Search ............. 174/260, 174/262

See application file for complete search history.

(56) References Cited

U.S. PATENT DOCUMENTS 6,884,652 B2 * 4/2005 Huang et al. ............... 438/106
7,060,604 B2   6/2006 Kata et al.
7,064,011 B2 * 6/2006 Ikenaga et al. ............. 438/118
7,262,514 B2 * 8/2007 Yoshikawa et al. ......... 257/793
2004/0256742 A1  12/2004 Usui et al.
2005/0252682 A1  11/2005 Shimoto et al.

FOREIGN PATENT DOCUMENTS

| JP | 2004-111536 A | 4/2004 |
| JP | 2004-253674 A | 9/2004 |
| JP | 2004-274071 A | 9/2004 |
| JP | 2005-175510 A | 6/2005 |
| JP | 2005-294285 A | 10/2005 |
| JP | 2005-302922 A | 10/2005 |
| JP | 2005-327780 A | 11/2005 |

* cited by examiner

*Primary Examiner*—Ishwarbhai B Patel
(74) *Attorney, Agent, or Firm*—Foley & Lardner LLP

(57) ABSTRACT

An electronic device substrate is formed of a thin-plate reinforcing substrate; an external connection wiring layer stacked on the reinforcing substrate, and comprising an electrical insulation provided on the reinforcing substrate, an opening formed in the electrical insulation, a first conductor pattern and a via-hole conductor provided in the opening and formed integrally with each other; and a second conductor pattern formed on the opposite side of the electrical insulation to the reinforcing substrate, and at least partially electrically connected to the via-hole conductor.

12 Claims, 7 Drawing Sheets

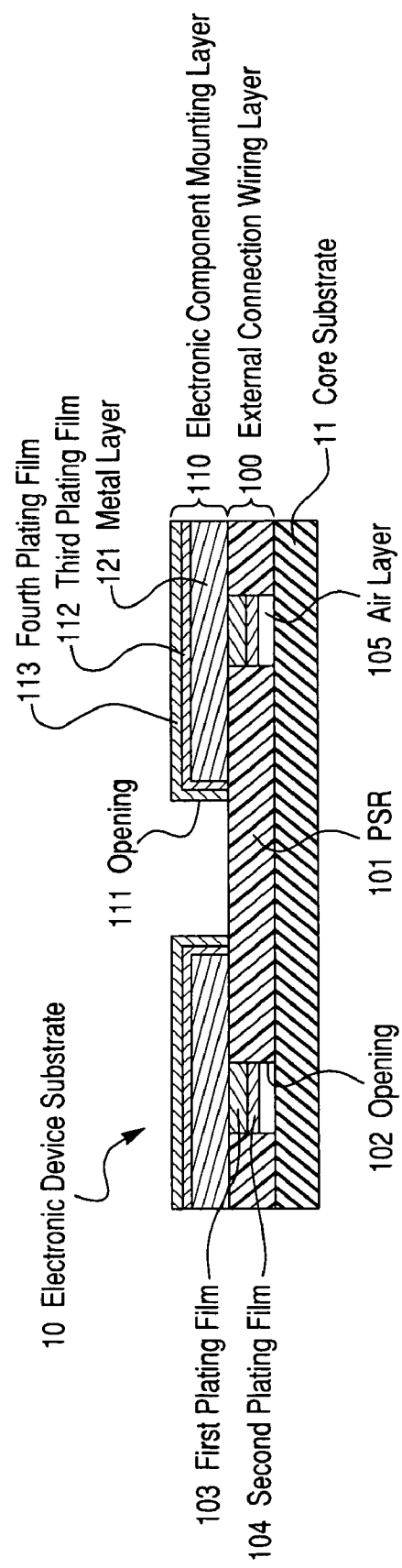

ELECTRONIC DEVICE SUBSTRATE AND ITS FABRICATION METHOD, AND ELECTRONIC DEVICE AND ITS FABRICATION METHOD

The present application is based on Japanese patent application Nos. 2006-107842, the entire contents of which are incorporated herein by reference.

BACKGROUND OF THE INVENTION

1. Field of the Invention

The present invention relates to an electronic device substrate and its fabrication method, and an electronic device using the electronic device substrate and its fabrication method. Particularly, it relates to an electronic device substrate capable of forming a core-substrateless package with internal electrical wiring, and its fabrication method, and an electronic device using the electronic device substrate and its fabrication method.

2. Description of the Related Art

With technological development in recent years, there is an increasing demand for thin electronic device packages, and electronic devices called core-substrateless package are therefore practically used.

As an example of a general core-substrateless package, JP-A-2004-253674 discloses an electronic device employing a technique using a substrate with a metal electrode connected on a core substrate to mount an electronic component on the substrate, and electrically connect it to a specified electrode with a metal wire, followed by resin sealing and subsequent physical releasing of the core substrate, to expose the metal electrode to the lower surface of the package.

Because this electronic device is covered with sealing resin and has leadless structure that exposes the metal electrode on its backside, a portion corresponding to the substrate comprises the metal electrode only so that the electronic device is very thin.

Also, as an example of another core-substrateless package, JP-A-2004-111536 discloses an electronic device, in which a first wiring layer is arranged on a first interlayer insulating layer, to arrange thereon a second interlayer insulating layer, form a hole in a specified position of this interlayer insulating layer to arrange a via conductor, and sequentially desired times arrange thereon a wiring layer and an interlayer insulating layer with a via conductor, to construct a metallic base frame in laminate.

JP-A-2004-111536 further discloses constructing the electronic device with a general flip-chip fabrication method that subsequently connects a semiconductor to the above substrate via a metallic bump.

According to the structure of JP-A-2004-253674, however, because of no retaining material around the metal electrode, there is the problem that multi-layer wiring is difficult.

Also, according to the structure of JP-A-2004-111536, because of the presence of the interlayer insulating layer, multi-layer wiring is possible, but a very thin substrate such as that disclosed in JP-A-2004-253674 is impossible to fabricate.

Thus there is the first problem of incompatibility between having a very thin substrate such as that of the general core-substrateless package and employing multi-layer wiring structure. This is caused by making the via conductor in making multi-layer wiring structure. The reason for that is as follows.

As mentioned above, although in the structure of JP-A-2004-111536 the multi-layer structure is possible to fabricate because of the presence of the interlayer insulating layer, this multi-layer structure, in which copper is stacked on upper and lower surfaces of the interlayer insulating layer of each single layer plate to form thereon wiring patterns, requires the via conductor to connect the wiring patterns formed on the upper and lower surfaces. This means that the thickness of each single layer plate has to be equal to the thickness of the interlayer insulating layer plus the respective thicknesses of the upper and lower wiring patterns. Further, when a conductive material (typically copper) is formed on the via side surface by plating in the via conductor fabrication process, because of the micro hole, the circulation of the plating liquid is poor, and in addition, it is difficult to grow the plating due to plating application to the insulation, in which case, to ensure connection reliability, its plating thickness is required to be on the order of 10 μm on the wiring patterns, therefore making the wiring patterns combined with the copper wiring patterns originally present typically approximately 25-30 μm thick. When fabricating the multi-layer substrate, the thickness of this wiring pattern is required by the number of wiring layers.

As one method for reducing the size and thickness of electronic device, there is a flip-chip technique that connects an electronic component and a substrate via a bump. This allows size reduction, compared to the case of metallic wire connection of the electronic component and the substrate, because a connection electrode of the substrate can be formed inside the electronic component. Further, forming the above connection with a metallic wire requires height for extending the metallic wire, but the flip-chip technique reduces electronic device thickness because this height may be height of the bump. Because in the flip-chip technique, the electrodes on the electronic component are small in size and dense in spacing by its microfabrication, the electronic device practically has internal wiring formed to the substrate, and an external electrode has to be positioned so that the electronic device can be mounted on a mother board on which the electronic device is to be mounted. For this reason, fabricating in multiple layers the substrate that is as thin and small as that of the general core-substrateless package means that the flip-chip technique may be employed in the general core-substrateless package, and is therefore crucial in promoting size and thickness reduction of the electronic device. Generally, in employing this flip-chip technique, if a bi-wiring-layer comprising one internal wiring layer and one external wiring layer can be realized, it is possible to employ the flip-chip technique.

The second problem is that of manufacturing cost and of global environment protection. It is obvious that the core substrate should be removed in manufacturing the core-substrateless package. In view of JP-A-2004-253674 and JP-A-2004-111536, even though there is the difference between their removal methods, they has to remove the core substrate. The removed core substrate cannot be recycled in both cases of etching removal and physical peeling removal. This is because the core substrate removal has to be performed after the electronic component is mounted and resin-sealed to the substrate with the core substrate. In the manufacturing process of the electronic device, oxidation or strain is caused in the core substrate by heat applied to this device, which results in difficulty recycling. This not only increases manufacturing cost of this core-substrateless package, but also increases waste, therefore also causing problems from the point of view of global environment protection.

SUMMARY OF THE INVENTION

Accordingly, it is an object of the present invention to provide an electronic device substrate which is as very thin as a core-substrateless package but capable of bilayer wiring, and an electronic device with the electronic device substrate and a fabrication method therefor.

It is also another object of the present invention to provide an electronic device substrate, an electronic device with the electronic device substrate and a fabrication method therefor, which realizes the above object and can restrain manufacturing cost and waste (core substrate).

(1) According to a first aspect of the invention, an electronic device substrate comprises:

a thin-plate reinforcing substrate;

an external connection wiring layer stacked on the reinforcing substrate, and comprising an electrical insulation provided on the reinforcing substrate, an opening formed in the electrical insulation, a first conductor pattern and a via-hole conductor provided in the opening and formed integrally with each other; and a second conductor pattern formed on the opposite side of the electrical insulation to the reinforcing substrate, and at least partially electrically connected to the via-hole conductor.

In the above invention (1), the following modifications and changes can be made.

(i) The electronic device substrate further comprises:

an air layer between the first conductor pattern and the reinforcing substrate.

(ii) The reinforcing substrate comprises any of metallic materials comprising acryl, epoxy, polyimide, or adhesive coated thereover, or a combination thereof.

(iii) The first conductor pattern and the via-hole conductor integral with each other comprise a single layer of an element of gold, silver, copper, nickel, palladium, tin, rhodium, or cobalt, or an alloy thereof, or a stacked layer thereof.

(iv) The first conductor pattern and the via-hole conductor integral with each other comprise in its constituents at least 5 μm or more copper or its alloy plating, or 3 μm or more nickel or its alloy plating.

(v) The height (thickness) of the first conductor pattern and the via-hole conductor integral with each other is smaller than the height (thickness) of the electrical insulation.

(vi) The electrical insulation comprises solder resist or photo-solder resist.

(2) According to a second aspect of the invention, a method for fabricating an electronic device substrate comprises the steps of:

forming an electrical insulation on a metallic layer, the metallic layer and a carrier layer constituting a composite substrate;

forming an opening in the electrical insulation;

forming in the opening a first conductor pattern and a via-hole conductor integrally with each other;

bonding a thin-plate reinforcing substrate to the opposite side of the electrical insulation to the composite substrate;

physically releasing the composite substrate so that only the metallic layer is left; and forming a second conductor pattern in the remaining metallic layer.

In the above invention (2), the following modifications and changes can be made.

(i) The composite substrate comprises a release layer between the metallic layer and the carrier layer.

(ii) The adhesive force between the metallic layer and the carrier layer via the release layer is smaller than the adhesive force between the metallic layer and the electrical insulation.

(iii) The release layer is an organic release layer or an inorganic release layer.

(iv) The metallic layer comprises copper and its alloy foil, stainless foil, aluminum and its alloy foil, nickel and its alloy foil, or tin and its alloy foil.

(v) The composite substrate comprises a support substrate laminated on the carrier layer side.

(vi) The support substrate comprises an insulating film.

(vii) The support substrate comprises an electrical insulating film comprising adhesive, and is integral with the composite substrate using the adhesive.

(3) According to a third aspect of the invention, an electronic device comprises:

an electronic device substrate comprising an electrical insulation, an opening formed in the electrical insulation, a first conductor pattern and a via-hole conductor integral with each other provided in the opening so that their combined thickness is smaller than the thickness of the electrical insulation, and a second conductor pattern at least partially electrically connected to the via-hole conductor formed on one side of the electrical insulation;

an electronic component comprising an electrode electrically connected to the second conductor pattern; and an insulative covering material for covering the electronic component.

In the above invention (3) the following modifications and changes can be made.

(i) The first conductor pattern is connected with solder.

(ii) The electronic component is electrically connected to the second conductor pattern via a metallic wire.

(iii) The electronic component is electrically connected to the second conductor pattern via a bump.

(iv) The second conductor pattern comprises a bump-connectable plating film.

(4) According to a fourth aspect of the invention, a method for fabricating an electronic device using an electronic device substrate that comprises a thin-plate reinforcing substrate, an external connection wiring layer stacked on the reinforcing substrate, and comprising an electrical insulation provided on the reinforcing substrate, an opening formed in the electrical insulation, a first conductor pattern and a via-hole conductor provided in the opening and formed integrally with each other, and a second conductor pattern formed on the opposite side of the electrical insulation to the reinforcing substrate, and at least partially electrically connected to the via-hole conductor, the method comprises the steps of:

mounting an electronic component in the electronic device substrate;

electrically connecting a specified electrode of the electronic component and the second conductor pattern;

covering with an insulative covering material at least the electrical connection portion of the electronic component and the second conductor pattern; and removing the reinforcing substrate from the electronic device substrate.

In the above invention (4), the following modifications and changes can be made.

(i) The step of removing the reinforcing substrate comprises physical release.

ADVANTAGES OF THE INVENTION

According to the present invention, it is possible to provide an electronic device substrate which is as very thin as a core-substrateless package but capable of bilayer wiring, and an electronic device with the electronic device substrate. It is also possible to provide an electronic device substrate, which is as very thin as a core-substrateless package but capable of bilayer wiring, and restraining manufacturing cost and waste (core substrate), and an electronic device with the electronic device substrate.

BRIEF DESCRIPTION OF THE DRAWINGS

The preferred embodiments according to the invention will be explained below referring to the drawings, wherein:

FIG. 1 is a cross-sectional view showing an electronic device substrate in a first preferred embodiment according to the present invention;

DETAILED DESCRIPTION OF THE PREFERRED EMBODIMENTS

First Embodiment

Figure 2A:
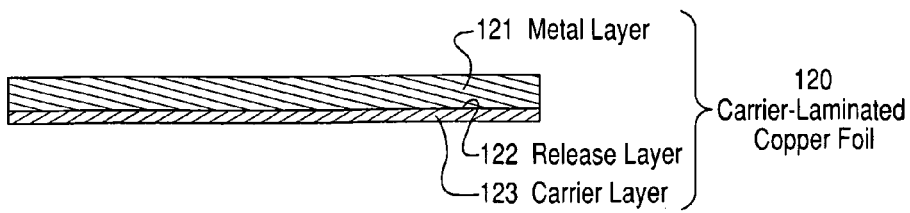
FIGS. 2A-2G are an explanatory diagram showing a fabrication process for the electronic device substrate of FIG. 1.

Electronic device substrate structure FIG. 1 is a cross-sectional view showing an electronic device substrate in a first preferred embodiment according to the present invention. The electronic device substrate (a bilayer wiring substrate) 10 comprises a thin-plate core substrate (a reinforcing substrate) 11, an external connection wiring layer 100 provided on the core substrate 11, and an electronic component mounting layer 110 provided on the external connection wiring layer 100.

Core Substrate 11

When only the external connection wiring layer 100 and the electronic component mounting layer 110 are used, the strength of the substrate is insufficient. For this reason, the reinforcing substrate is mounted to reinforce the strength of the substrate.

The core substrate 11 to serve as the reinforcing substrate is required to be resistant to heat caused in the electronic component fabrication process. Its material may use any of metallic materials with acryl, epoxy, polyimide, or adhesive coated thereover, or a combination thereof. Particularly, it is desirable to use a subsequently easily peelable material, such as a UV release tape (an ultraviolet-curable adhesive tape).

External Connection Wiring Layer 100

The external connection wiring layer 100 has conductive plating applied to an opening 102 (a first plating film 103 on the electronic component mounting layer 110 side and a second plating film 104 on the core substrate 11 side), provided in electrically-insulative photo-solder resist (hereinafter, PSR) 101.

The conductive plating (the first plating film 103 and the second plating film 104) forms a thinner film than the thickness of the external connection wiring layer 100, and there is an air layer 105 between the core substrate 11 and the conductive plating (the second plating film 104). This allows preventing resin on the release side from remaining on the metal electrode after releasing the core substrate 11.

The PSR 101 uses liquid photo-solder resist that uses photosensitive resin (epoxyacrylate-based UV-curable resin), for example. Because a solder resist pattern only has to be formed, there is no particular limitation on its material, method, etc.

The first plating film 103 uses a single layer of an element of gold, silver, copper, nickel, palladium, tin, rhodium, or cobalt, or an alloy thereof, or a stacked layer thereof.

The second plating film 104, taking account of soldering of electronic device, uses a single layer of an element of gold, silver, copper, nickel, palladium, tin, rhodium, or cobalt, or an alloy thereof, or a stacked layer thereof.

Electronic Component Mounting Layer 110

The electronic component mounting layer 110 is provided on the PSR 101, and comprises a metal layer 121 formed with an opening 111, a third plating film 112 applied over the metal layer 121 (including the wall of the opening 111), a fourth plating film 113 applied over the third plating film 112. The lowest metal layer 121 of the electronic component mounting layer 110 is at least partially electrically connected to the first plating film 103.

The metal layer 121 material may use copper and its alloy foil, stainless foil, aluminum and its alloy foil, nickel and its alloy foil, or tin and its alloy foil.

The third plating film 112 may use a relatively hard plating film, such as nickel, and is 0.75 μm thick, for example.

The fourth plating film 113 may use gold bump or solder bump-connectable gold, tin, palladium, or solder plating.

In this embodiment, the first plating film 103 forms a via-hole conductor, the second plating film 104 a first conductor pattern and the metal layer 121 a second conductor pattern, so that the electronic device substrate 10 serves as a bilayer wiring substrate.

Electronic Device Substrate Fabrication Method

Next, an electronic device substrate fabrication method according to the first embodiment is explained. FIGS. 2A-2G and 3H-3M are an explanatory diagram showing a fabrication process for the electronic device substrate of FIG. 1.

Figure 2B:
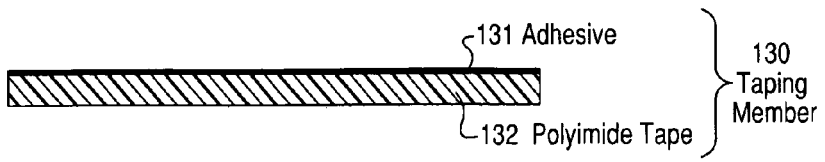

First, there is prepared carrier-laminated copper foil 120 comprising three layers of metal layer 121/release layer 122/carrier layer 123 (FIG. 2A). As a support substrate, there is prepared a taping member 130 with a polyimide tape 132 as an insulating film coated with 12 μm thick adhesive 131, for example (FIG. 2B).

The carrier-laminated copper foil 120 refers to a base material constructed by forming, to the metal layer (18 μm or thicker metal (in this case, copper) foil) 121, the release layer 122 with weak adhesion to be peelable in the subsequent step, followed by electrolytic formation of the carrier layer (thin, e.g., 1-5 μm metal foil) 123, to provide metal (in this case, copper) foil.

Figure 2C:
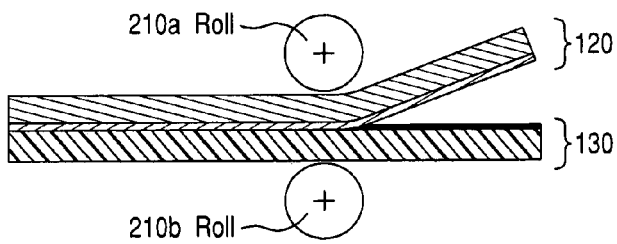

As shown in FIG. 2C, these are superimposed as the carrier layer 123 of the carrier-laminated copper foil 120 and the adhesive 131 of the taping member 130 face each other, and are passed through between a pair of rolls 210a and 210b, to laminate the carrier-laminated copper foil 120 and the taping member 130. This causes the taping member 130 to be joined to the carrier layer 123 surface by the adhesive 131.

By making the adhesive force between the release layer 122 and carrier layer 123 larger than the adhesive force between the release layer 122 and metal layer 121, it is possible to mechanically release and separate the release layer 122 and metal layer 121 in the subsequent step. This release layer 122 may be either an organic release layer or an inorganic release layer, which has the above adhesive force difference.

Figure 2D:
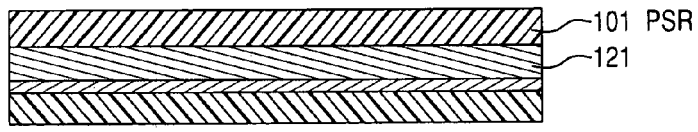

Next, as shown in FIG. 2D, the metal layer 121 is coated with e.g., 15 μm thick PSR 101, using screen printing.

Figure 2E:
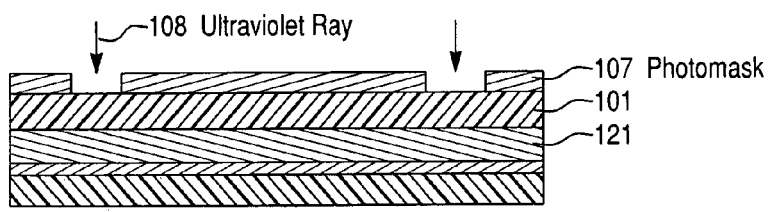
Figure 2F:
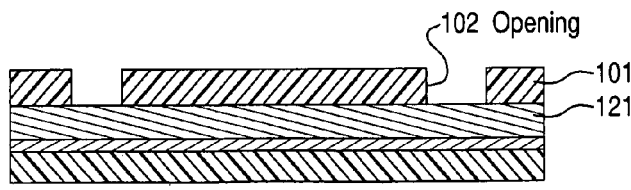

Next, as shown in FIG. 2E, the PSR 101 is irradiated with ultraviolet rays 108 via a photomask 107, followed by development and, as shown in FIG. 2F, subsequent formation of a desired-shape opening 102 in the PSR 101.

Figure 2G:
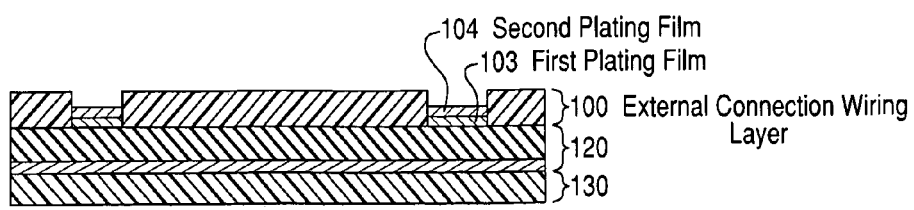

Next, as shown in FIG. 2G, in the opening 102 is formed a first plating film 103 to be at least partially electrically connected to the metal layer 121. To the first plating film 103 is applied a second plating film 104. The thickness of the first plating film 103 is 5 μm or more for copper or its alloy plating, and 3 μm or more for nickel or its alloy plating. The first and second plating films 103 and 104 are formed such that their combined thickness is thinner than that of the PSR 101.

Figure 3H:
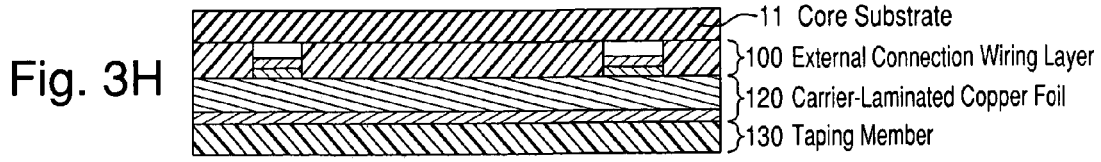
FIGS. 3H-3M are an explanatory diagram showing a fabrication process for the electronic device substrate of FIG. 1.

Next, as shown in FIG. 3H, the core substrate 11 is bonded to the PSR 101. The core substrate 11 uses a UV release tape, for example. This core substrate 11 may also use a material, other than the UV release tape, that can be easily released from the external connection wiring layer 100. The second plating film 104, which serves as an external connection terminal, and the core substrate 11 are not in contact with each other because of the presence of the air layer 105, and therefore when the core substrate 11 is released, it is possible to avoid contamination of the second plating film 104 with residual resin due to the core substrate 11 releasing.

Also, by providing the core substrate 11, the strength of the electronic device substrate 10 is increased, which allows the electronic component mounting layer 110 and the external connection wiring layer 100 to be protected from physical stress in the fabrication process of the electronic device shown in the second embodiment of the present invention.

Figure 3I:
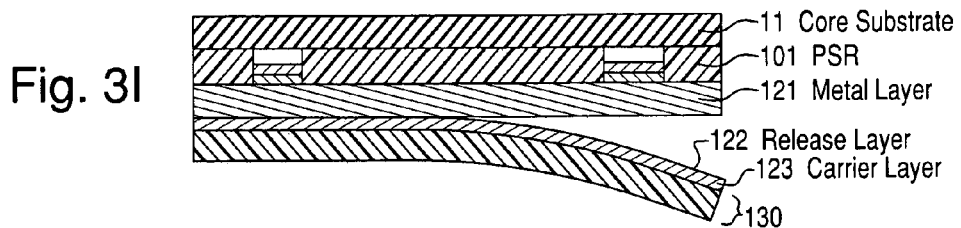
Figure 3J:
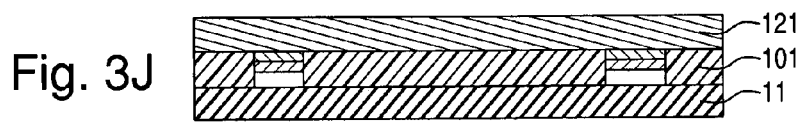

Next, as shown in FIGS. 3I and 3J, the release layer 122, the carrier layer 123 and the taping member 130 (the adhesive 131 and the polyimide tape 132) are mechanically released and removed from the metal layer 121 of the carrier-laminated copper foil 120.

Figure 3K:
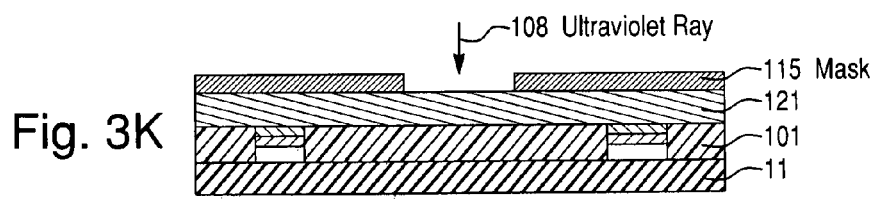
Figure 3L:
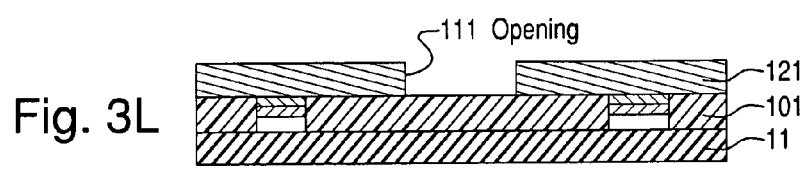

Next, as shown in FIGS. 3K and 3L, a desired pattern is formed in the metal layer 121 with a photomask 115 and ultraviolet rays 108.

Figure 3M:
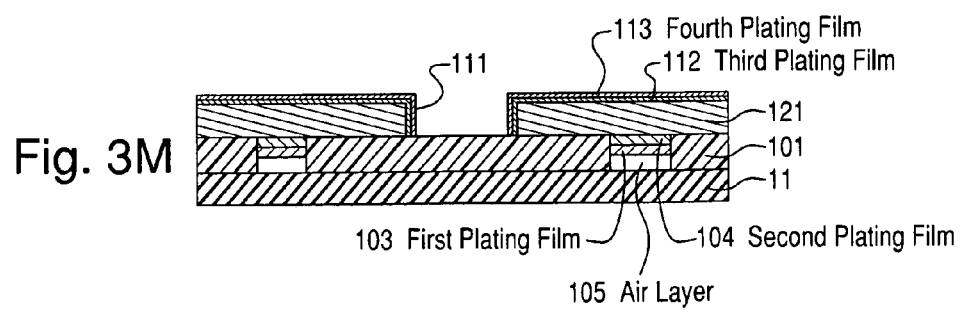

Finally, as shown in FIG. 3M, over the metal layer 121 surface (including the wall of the opening 111) is formed a third plating film 112, and thereover is formed a fourth plating film 113. The third and fourth plating films 112 and 113 have structure taking account of flip-chip connection of an electronic component. The third plating film 112 may use a relatively hard plating film, such as nickel, and is 0.75 μm thick, for example.

Advantages of the First Embodiment

This embodiment has the following advantages:

(1) Since the electronic device substrate according to this embodiment forms the hole in the thin-plate electrical insulation and the conductive material in the opening and has the conductive pattern and the via-hole conductor to serve as the single layer plate, on which a wiring pattern inside the package can be formed by fabricating the metal layer, bilayer wiring is possible with substrate thickness held as very thin as that of the core-substrateless package. This also allows the bilayer wiring substrate to be fabricated in the core-substrateless package. It is also possible to provide an electronic device using the same bilayer wiring substrate.

(2) Although the prior art bi-wiring substrate required an external connection terminal layer and a via-hole layer to be separate, this embodiment makes it possible to combine them into one layer, and thereby has the effect of making substrate thickness thin.

(3) Unlike the prior art substrate, because of the mutually integral via and external connection wiring layers and no need of a via-hole land, it is possible to reduce wiring area, and thereby provide a smaller electronic device. Because of the thin PSR film, it is possible to reduce wiring width, and thereby provide a smaller PKG.

Second Embodiment

Electronic Device Structure

Figure 4:
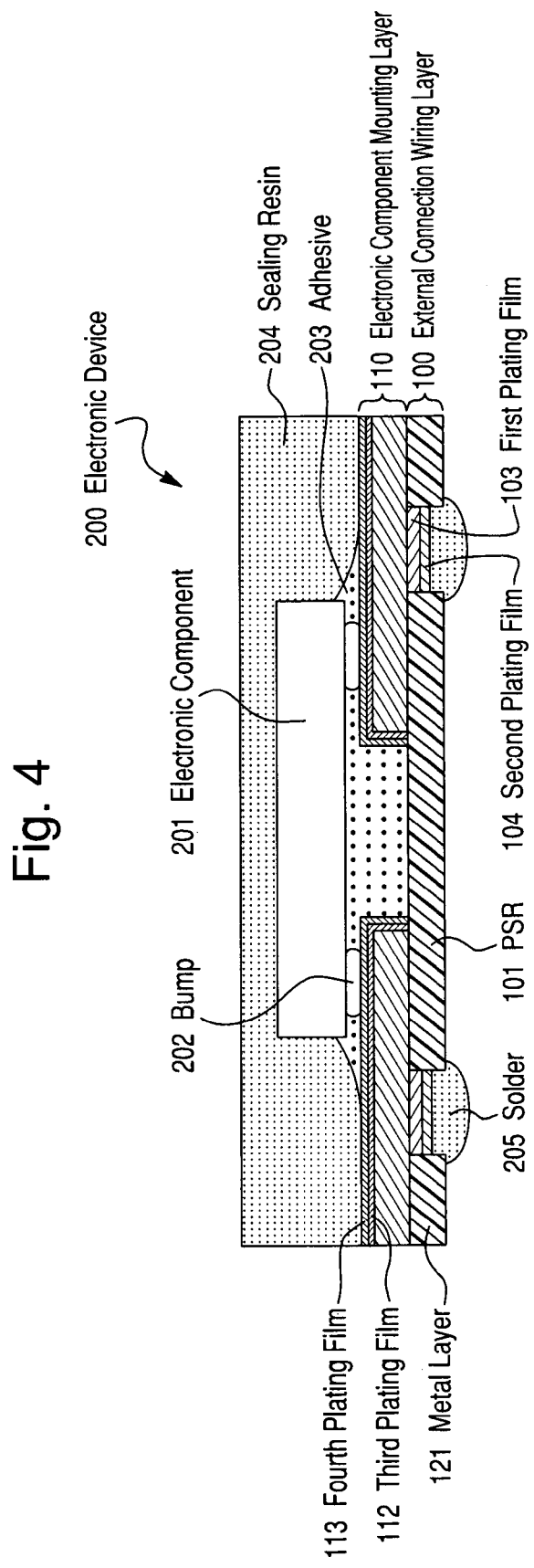
FIG. 4 is a cross-sectional view showing an electronic device in a second preferred embodiment according to the present invention.

FIG. 4 is a cross-sectional view showing an electronic device in a second preferred embodiment according to the present invention.

Electronic device 200 comprises an electronic device substrate 10 according to the first embodiment, and an electronic component 201 electrically connected via a bump 202 to an electronic component mounting layer 110 of the electronic device substrate 10. It should be noted, however, that a core substrate 11 of the electronic device substrate 10 is removed and that solder (solder ball) 205 is mounted over a second plating film 104.

To reinforce electrical connection of the bump 202 and electronic component mounting layer 110, the electronic component 201 and electronic component mounting layer 110 are fixed to each other using adhesive 203. Also, to protect the electronic component 201, its periphery is covered in sealing resin 204.

The conductive plating of an external connection wiring layer 100 of the electronic device substrate 10 comprises the integral material comprising a second plating film 104 used for external connection, and a first plating film 103 used for electrical connection to the electronic component mounting layer 110, to serve both as a conductor pattern and as a via-hole conductor for electrical connection of an external connection terminal and the upper electronic component mounting layer 110. Specifically, electrical signals of the electronic component 201 are sent to the second plating film 104 via the bump 202, the conductive plating of the electronic component mounting layer 110 and the first plating film 103 of the external connection wiring layer 100, and to outside via the solder 205 electrically connected to the second plating film 104.

Electronic Device Fabrication Method

Next, an electronic device fabrication method according to the second embodiment is explained referring to FIGS. 5A-5G. FIGS. 5A-5G are an explanatory diagram showing a fabrication process for the electronic device substrate of FIG. 4.

Figure 5A:
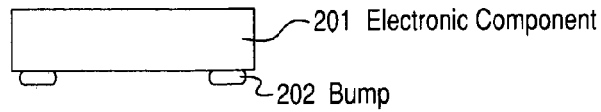
FIGS. 5A-5G are an explanatory diagram showing a fabrication process for the electronic device substrate of FIG. 4.

First, there is prepared the electronic device substrate 10 according to the first embodiment. As shown in FIG. 5A, there is provided the bump 202 to an output electrode of the electronic component 201.

Figure 5B:
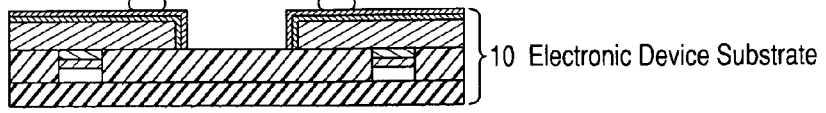
Figure 5C:
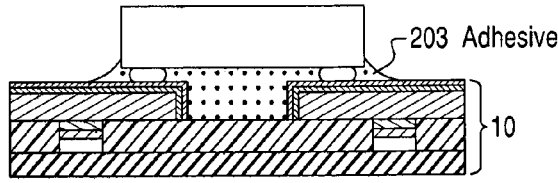

Next, as shown in FIG. 5B, the electronic component 201 is flip-chip connected to the fourth plating film 113 of the electronic component mounting layer 110 of the electronic device substrate 10. To reinforce electrical connection of the bump 202 and electronic component mounting layer 110, as shown in FIG. 5C, the electronic component 201 and electronic component mounting layer 110 are fixed to each other using adhesive 203.

Figure 5D:
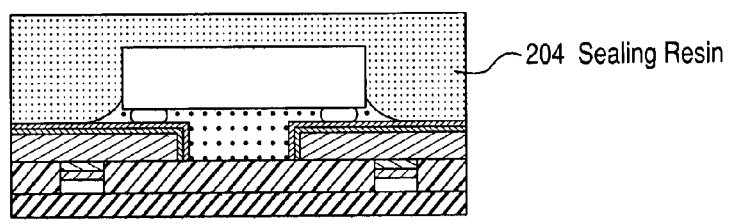

Next, as shown in FIG. 5D, to protect the electronic component 201, by use of transfer molding, electronic component mounting surfaces of the electronic component 201 and electronic component mounting layer 110 are covered with sealing resin 204.

Figure 5E:
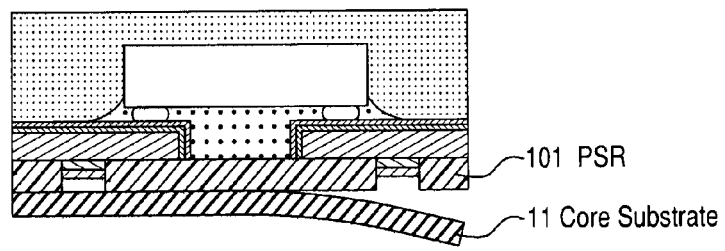
Figure 5F:
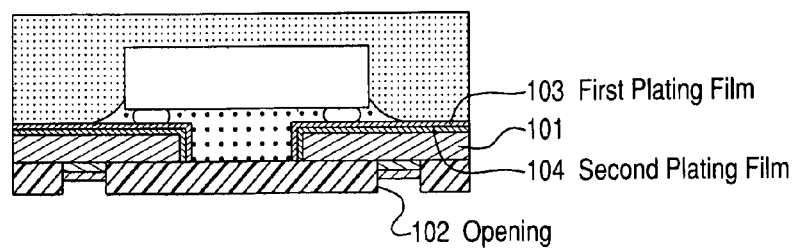

Next, as shown in FIGS. 5E and 5F, the core substrate 11 is mechanically released and removed from the PSR 101. When a UV release tape, for example, is used as the core substrate 11 material, it is irradiated with UV light to remove adhesion, followed by mechanical peeling to remove the core substrate 11.

Figure 5G:
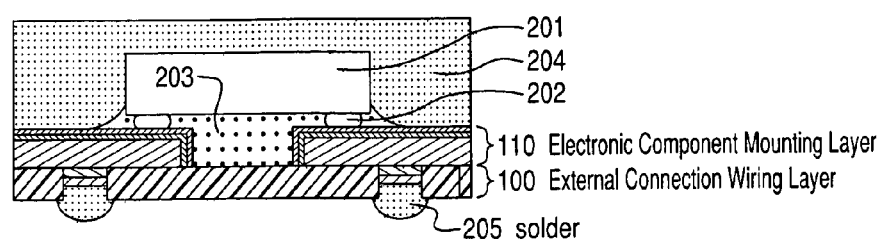

Finally, as shown in FIG. 5G, a solder ball 205 is mounted over the second plating film 104 in opening 102 formed by an air layer 105 of the external connection wiring layer 100.

Advantages of the Second Embodiment

This embodiment has the following advantages: By core substrate removal, a thinner electronic device can be obtained. And more the carrier layer 123 and the taping member 130 are physically peeled prior to electronic component mounting to the substrate according to the first embodiment, heat applied in electronic device packaging is not applied to this carrier layer 123-laminated taping member 130, thus causing no problems of oxidation or strain. For this reason, it is possible to recycle the released carrier layer 123-laminated taping member 130 as a flexible wiring board substrate because of polyimide taping member 130 in this embodiment. This allows a reduction of waste produced during semiconductor device fabrication, and therefore a contribution to global environment protection.

Third Embodiment

Electronic Device Substrate Fabrication Method

Next, with respect to an substrate with the same structure as the electronic device substrate 10 according to the first embodiment, another fabrication method is explained as the third embodiment. The fabrication method according to this embodiment fabricates the electronic device substrate without using the polyimide support substrate (polyimide tape 132) used in the fabrication method explained in the first embodiment. The electronic device with the electronic device substrate 10 according to this embodiment is similar in its structure and fabrication method to the second embodiment.

Figure 6A:
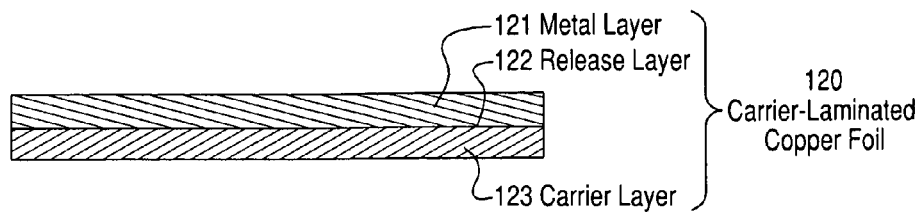
FIGS. 6A-6F are an explanatory diagram showing another fabrication process for the electronic device substrate of FIG. 1.

FIGS. 6A-6F and 7G-7K are an explanatory diagram showing another fabrication process for the electronic device substrate of FIG. 1. First, similarly to the first embodiment, there is prepared carrier-laminated copper foil 120 comprising three layers of metal layer 121/release layer 122/carrier layer 123 (FIG. 6A).

By making the adhesive force between the release layer 122 and carrier layer 123 larger than the adhesive force between the release layer 122 and metal layer 121, it is possible to mechanically release and separate the release layer 122 and metal layer 121 in the subsequent step. This release layer 122 may be either an organic release layer or an inorganic release layer, which has the above adhesive force difference.

Figure 6B:
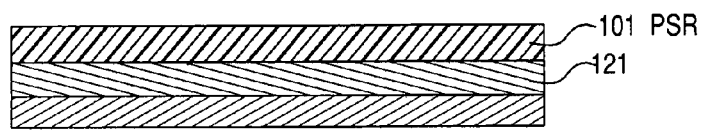

Next, as shown in FIG. 6B, the metal layer 121 is coated with e.g., 15 μm thick PSR 101, using screen printing.

Figure 6C:
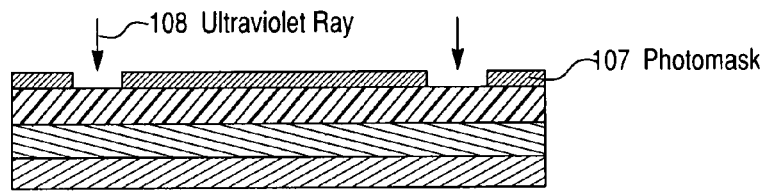
Figure 6D:
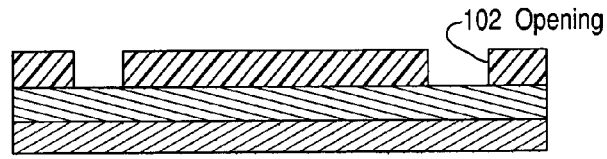

Next, as shown in FIG. 6C, the PSR 101 is irradiated with ultraviolet rays 108 via a photomask 107, followed by development and, as shown in FIG. 6D, subsequent formation of a desired-shape opening 102 in the PSR 101.

Figure 6E:
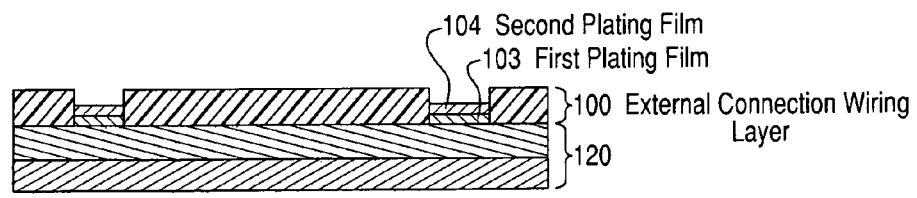

Next, as shown in FIG. 6E, in the opening 102 is formed a first plating film 103 to be at least partially electrically connected to the metal layer 121. To the first plating film 103 is applied a second plating film 104. The thickness of the first plating film 103 is 5 μm or more for copper or its alloy plating, and 3 μm or more for nickel or its alloy plating. The first and second plating films 103 and 104 are formed such that their combined thickness is thinner than that of the PSR 101.

Figure 6F:
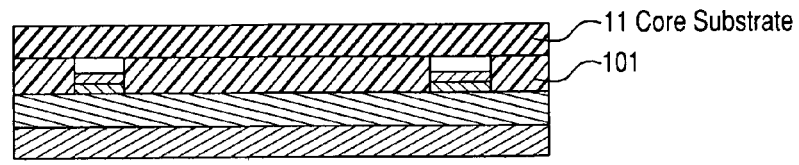

Next, as shown in FIG. 6F, the core substrate 11 is bonded to the PSR 101. The core substrate 11 uses a UV release tape, for example. This core substrate 11 may also use a material, other than the UV release tape, that can be easily released from the external connection wiring layer 100. The second plating film 104, which serves as an external connection terminal, and the core substrate 11 are not in contact with each other because of the presence of the air layer 105, and therefore when the core substrate 11 is released, it is possible to avoid contamination of the second plating film 104 with residual resin due to the core substrate 11 releasing.

Also, by providing the core substrate 11, the strength of the electronic device substrate 10 is increased, which allows the electronic component mounting layer 110 and the external connection wiring layer 100 to be protected from physical stress in the fabrication process of the electronic device shown in the second embodiment of the present invention.

Figure 7G:
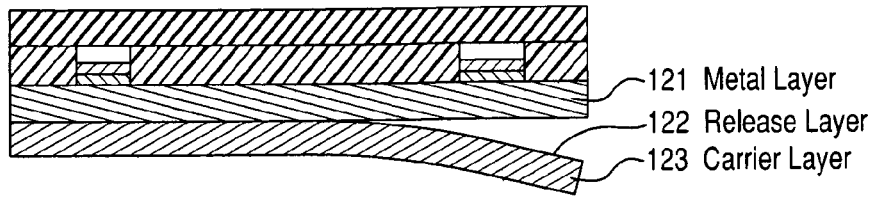
FIGS. 7G-7K are an explanatory diagram showing another fabrication process for the electronic device substrate of FIG. 1.
Figure 7H:
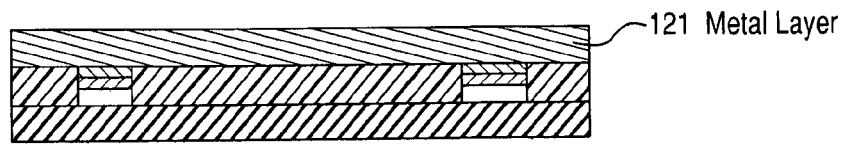

Next, as shown in FIGS. 7G and 7H, the release layer 122 and the carrier layer 123 are mechanically released and removed from the metal layer 121 of the carrier-laminated copper foil 120.

Figure 7I:
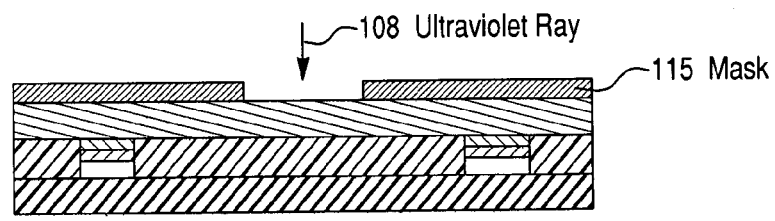
Figure 7J:
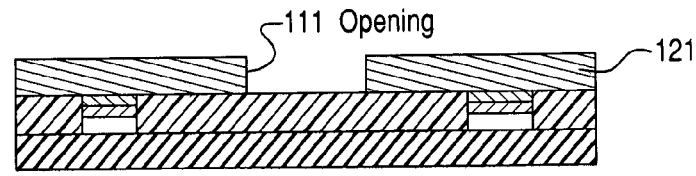

Next, as shown in FIGS. 7I and 7J, a desired pattern is formed in the metal layer 121 with a photomask 115 and ultraviolet rays 108.

Figure 7K:
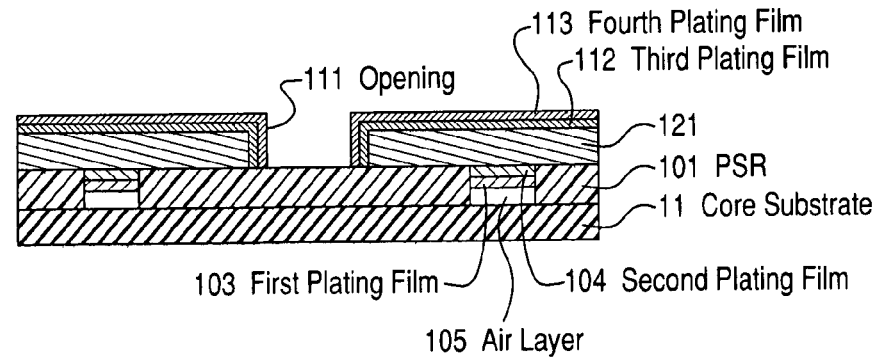

Finally, as shown in FIG. 7K, over the metal layer 121 surface (including the wall of the opening 111) is formed a third plating film 112, and thereover is formed a fourth plating film 113. The third and fourth plating films 112 and 113 have structure taking account of flip connection of an electronic component. The third plating film 112 may use a relatively hard plating film, such as nickel, and is 0.75 μm thick, for example. The fourth plating film 113 uses gold bump or solder bump-connectable gold, tin, palladium, or solder plating, for example.

Advantages of the Third Embodiment

This embodiment has the following advantage in addition to those of the first embodiment: Because the fabrication method of this embodiment does not use the polyimide tape used in the first embodiment, it is possible to reduce cost in the fabrication process.

Other Embodiments

The invention is not limited to the above embodiments, but various modifications are possible within the scope not departing from or altering the technical ideas of the invention.

(1) In the above embodiments, besides the flip-chip technique using the bump 202 in mounting the electronic component 201, the electronic component 201 may be die-bonded to the electronic component mounting layer, for electrical signal connection by metallic wire bonding.

(2) Although in the above embodiments there is shown BGA (Ball Grid Array) structure using a solder ball in the external output terminal, it may be in an electronic device form of LGA (Land Grid Array) structure.

(3) Although in the above embodiments there is shown the example using one electronic component 201, it may use a multi-chip package in which are mounted plural components.

(4) The invention may be applied to electronic device in which plural electronic components are arrayed in unit area, collectively resin-sealed, and subsequently diced into individual pieces that correspond to unit devices.

(5) Although in the above embodiments there is shown the structure and fabrication method of the electronic device substrate and electronic device, because the electronic device of this invention can be applied to POP (Package On Package) which, in device packaging, stacks devices to reduce packaging area, it is capable of thin stacking compared to conventional electronic devices.

(6) In the above embodiments, this invention can likewise be applied to functional electronic components such as capacitors, inductors, transistors, diodes, MEMS, electrical filters, etc., as well as IC chips. Particularly, it can preferably be applied to electronic device used in cellular phones or IC cards which are required to be thin and small.

Although the invention has been described with respect to the specific embodiments for complete and clear disclosure, the appended claims are not to be thus limited but are to be construed as embodying all modifications and alternative constructions that may occur to one skilled in the art which fairly fall within the basic teaching herein set forth.

What is claimed is:

1. An electronic device substrate, comprising:
    a thin-plate core substrate;
    an external connection wiring layer stacked on the core substrate, and comprising an electrical insulation provided on the core substrate, an opening formed in the electrical insulation, a first conductor pattern and a via-hole conductor provided in the opening and formed integrally with each other;
    an air layer between the first conductor pattern and the core substrate; and
    a second conductor pattern formed on the opposite side of the electrical insulation to the core substrate, and at least partially electrically connected to the via-hole conductor;
    wherein the core substrate is releasable from the electrical insulation.

2. The electronic device substrate according to claim 1, wherein:
    The core substrate comprises any of metallic materials comprising acryl, epoxy, polyimide, or adhesive coated thereover, or a combination thereof.

3. The electronic device substrate according to claim 1, wherein:
    the first conductor pattern and the via-hole conductor integral with each other comprise a single layer of an element of gold, silver, copper, nickel, palladium, tin, rhodium, or cobalt, or an alloy thereof, or a stacked layer thereof.

4. The electronic device substrate according to claim 1, wherein:
    the first conductor pattern and the via-hole conductor integral with each other comprise in its constituents at least 5 μm or more copper or its alloy plating, or 3 μm or more nickel or its alloy plating.

5. The electronic device substrate according to claim 1, wherein:
    a height (thickness) of the first conductor pattern and the via-hole conductor integral with each other is smaller than a height (thickness) of the electrical insulation.

6. The electronic device substrate according to claim 1, wherein:
    the electrical insulation comprises solder resist or photo-solder resist.

7. The electronic device substrate, according to claim 1, wherein an interface between the via-hole conductor and the second conductor pattern is provided at a same level as an upper surface of the electrical insulation.

8. The electronic device substrate, according to claim 1, wherein an upper surface of the via-hole conductor and an upper surface of the electrical insulation are at a same level.

9. The electronic device substrate, according to claim 1, wherein the first conductor pattern and the second conductor pattern are made of different materials.

10. The electronic device substrate, according to claim 1, wherein the first conductor pattern and the second conductor pattern are separate, non-continuous layers.

11. The electronic device substrate, according to claim 1, wherein the first conductor pattern and the second conductor pattern are formed by separate processing steps.

12. The electronic device substrate, according to claim 1, wherein the first conductor pattern and the second conductor pattern are different layers.

* * * * *